United States Patent
Clevenger et al.

(10) Patent No.: US 7,544,602 B2
(45) Date of Patent: Jun. 9, 2009

(54) METHOD AND STRUCTURE FOR ULTRA NARROW CRACK STOP FOR MULTILEVEL SEMICONDUCTOR DEVICE

(75) Inventors: Lawrence A. Clevenger, LaGrangeville, NY (US); Matthew E. Colburn, Hopewell Junction, NY (US); William F. Landers, Wappingers Falls, NY (US); Wai-Kin Li, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 33 days.

(21) Appl. No.: 11/693,033

(22) Filed: Mar. 29, 2007

(65) Prior Publication Data

US 2008/0237868 A1    Oct. 2, 2008

(51) Int. Cl.
*H01L 23/522* (2006.01)
(52) U.S. Cl. ............... 438/619; 438/638; 257/E21.581; 257/E23.17
(58) Field of Classification Search ................. 438/619, 438/638, FOR. 355; 257/E21.581, E23.17
See application file for complete search history.

(56) References Cited

U.S. PATENT DOCUMENTS

| | | | |
|---|---|---|---|
| 5,119,164 A * | 6/1992 | Sliwa et al. ................. | 257/776 |
| 5,530,280 A | 6/1996 | White | |
| 5,665,655 A | 9/1997 | White | |
| 6,214,719 B1 * | 4/2001 | Nag ............................ | 438/619 |
| 6,261,945 B1 | 7/2001 | Nye, III et al. | |
| 6,346,484 B1 * | 2/2002 | Cotte et al. .................. | 438/725 |
| 6,492,247 B1 | 12/2002 | Guthrie et al. | |
| 7,078,814 B2 | 7/2006 | Stamper | |
| 7,098,676 B2 | 8/2006 | Landers et al. | |
| 2001/0040267 A1 * | 11/2001 | Lien et al. .................... | 257/522 |
| 2005/0093169 A1 * | 5/2005 | Kajita ......................... | 257/774 |
| 2006/0038297 A1 * | 2/2006 | Usami et al. ................. | 257/758 |
| 2008/0171432 A1 * | 7/2008 | Clevenger et al. ........... | 438/619 |

\* cited by examiner

*Primary Examiner*—George Fourson
(74) *Attorney, Agent, or Firm*—Rosa S. Yaghmour; Greenblum & Bernstein P.L.C.

(57) ABSTRACT

An integrated circuit design and a method of fabrication and, more particularly, a semiconductor structure having an ultra narrow crack stop for use in multilevel level devices and a method of making the same. The structure includes a first dielectric layer having a first connection connecting to an underlying interconnect and a second dielectric layer having a second connection connecting to the first connection. A stop gap structure extends through the first dielectric layer and the second dielectric layer, and has a width of about less than 1 um.

1 Claim, 8 Drawing Sheets

METHOD AND STRUCTURE FOR ULTRA NARROW CRACK STOP FOR MULTILEVEL SEMICONDUCTOR DEVICE

FIELD OF THE INVENTION

The invention generally relates to integrated circuit design and a method of fabrication and, more particularly, to a semiconductor structure having an ultra narrow crack stop for use in multilevel level devices and a method of making the same.

BACKGROUND OF THE INVENTION

To minimize the BEOL interconnect portion of circuit delay, a conventional $SiO_2$ dielectric (k~4.0) has been replaced with dense lower-k films (K<3.0). However, for even further performance improvement, more parasitic capacitance reduction is required (k<2.5) for high-speed circuits. Most of the porous low-k dielectric materials, though, have relatively weak mechanical properties as compared to dense dielectrics. As such, it has become a significant challenge for current BEOL processes to integrate these materials with other module processes. For example, the conventional chemical-mechanical polish process has difficulty polishing porous dielectrics, and the conventional PVD diffusion barrier deposition technology cannot offer reasonable coverage on the surface of porous dielectrics.

Moreover, it has been found that when the dielectric constant of an insulator in an interconnect structure is reduced, mechanical properties are often compromised, giving rise to significant challenges in interconnect integration and reliability. By way of illustration, due to low adhesion of the dielectric an interfacial crack may occur during fabrication. This is a particular problem in the fabrication of multilevel interconnected integrated circuits since it can significantly reduce yield and impair reliability of the device.

In one example, to increase throughput, a plurality of integrated circuits are fabricated on a wafer, in parallel, using porous low-k dielectrics. The integrated circuits are then separated into individual chips using a process known as "dicing." However, as the kerf is diced, cracks and delaminations can be generated that can propagate into the active chip regions. This has been found to be especially problematic in multilevel devices where the dielectric constant of the insulator in an interconnect of the integrated circuit is reduced, mainly due to the mechanical properties of the insulator. Cracks in excess of a few microns in depth and several tenths of millimeters in length have been observed. The cracks and delaminations can either result in chip yield loss or reliability issues as the chip is stressed in a package.

To combat this problem, an air gap between the diced channel and the active chip region is fabricated using conventional RIE (reactive ion etching) processes. By way of illustration, after the multilevel interconnected chip is fabricated, a single RIE process is used to etch through all of the layers, preferably to the first capping layer above the first dielectric. By using the crack stop (e.g., air gap), it has been found that the cracks and delaminations will terminate at the crack stop, prior to reaching the active chip area. That is, the crack stop will eliminate or significantly reduce the crack/delamination driving force such that the propagation of the crack/delamination will be stopped prior to reaching the chip active area.

However, in current RIE processes, the size of the crack stop design tends to be fairly wide, on the order of approximately 10 um. This is mainly due to the fact that RIE cannot effectively etch through several layers of dielectric, etc. without also increasing the width of the resultant trench. Without increasing the width of the trench, for example, the conventional RIE process cannot etch through all of the levels of the interconnected circuit, in particular the lower levels, and hence cannot effective stop the propagation of the crack.

Accordingly, there exists a need in the art to overcome the deficiencies and limitations described hereinabove.

SUMMARY OF THE INVENTION

In a first aspect of the invention, a multilevel structure comprises a first dielectric layer having a first connection therein which connects to an underlying interconnect. The structure further includes a second dielectric layer having a second connection therein which connects to the first connection. A crack stop structure extends through the first dielectric layer and the second dielectric layer. The crack stop structure has a width of about less than 1 um.

In a second aspect of the invention, a method of forming a structure comprises forming a connection via in a level of dielectric material and forming a crack stop feature via in the level of dielectric material. The connection via is filled with metallization while the crack stop feature via is blocked off to form a crack stop structure in the level of dielectric material.

In another aspect of the invention, a method of fabricating a multilevel structure comprises forming a first connection in a first dielectric layer and forming a second connection in a second dielectric layer which contacts the first connection. The method further includes forming a crack stop structure extending through the first dielectric layer and the second dielectric layer while forming a first via for the first connection and a second via for the second connection.

DETAILED DESCRIPTION OF EMBODIMENTS OF THE INVENTION

The invention is directed to semiconductor devices and methods of making the same. More particularly, aspects of the invention provide for both a narrow air gapped crack stop and isolated air gap in interconnect wiring without the use of additional masking levels. By implementing the invention, the crack stop (air gap) width can be less than a 1 um wide (i.e., about ⅒ of the standard crack stop width) and, as such, the overall kerf width can shrink. This results in more chips per wafer, i.e., a higher yield with improved reliability. Advantageously, the processes of the invention are compatible with current BEOL process flows, while providing improved technology extendibility, e.g., there is no limitation on dielectric materials used in the fabrication processes. Thus, the implementation of the present invention does not require new module development for creating etching profiles, provides better barrier coverage, and is capable of handling CMP processes.

Additionally, in implementation, during fabrication, air gap patterns are created at each pertinent level of the actual chip to provide for overall parasitic capacitance reduction during the via process. Moreover, the creation of air gaps inside the chip (microprocessor) provides a lower effective dielectric constant for the microprocessor.

Figure 1:
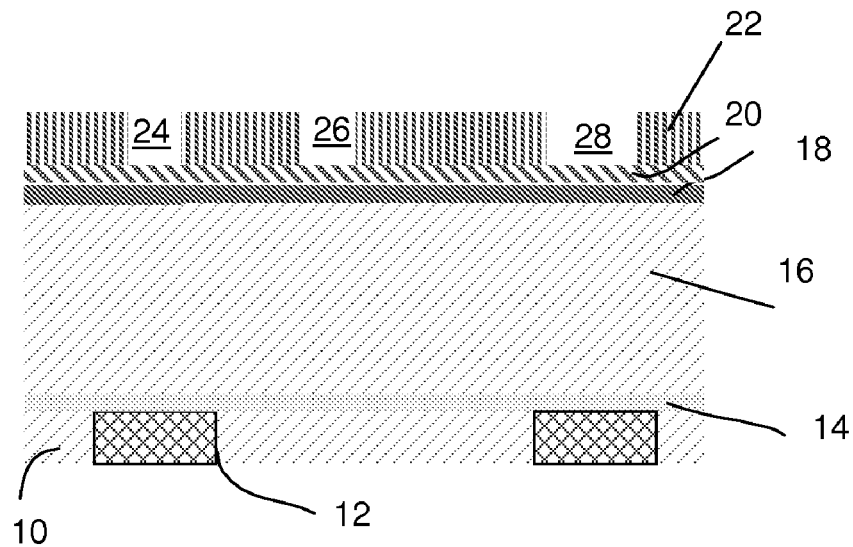
FIGS. 1 through 11 show process steps and intermediate structures according to aspects of the invention.

FIG. 1 shows an intermediate structure fabricated in a conventional manner. The intermediate structure comprises interconnects 12 provided in a dielectric layer 10. The interconnects 12 may be, for example, any metal used for interconnects such as copper (Cu), aluminum (Al), CU(Al) or tungsten (W). A capping layer (hardmask) 14 is deposited over the interconnects 12 and dielectric layer 10. The hardmask 14 may be any conventional capping layer such as, for example, an oxide or nitride based material. A low-k dielectric layer 16 is formed on the hardmask 14. In embodiments, the low-k dielectric material is, for example, organosilicate glass (OSG) films formed by conventional CVD processes.

Still referring to FIG. 1, a capping layer 18 is formed on the low-k dielectric layer 16. The capping layer 18 may be an oxide based material formed using any conventional process such as, for example, CVD. A conventional antireflective coating (ARC) 20 is provided on a surface of the capping layer 18. The ARC 20 may be a sacrificial layer of spin-on organic material such as that manufactured by Brewer Science, Inc.

A photoresist 22 is deposited on the antireflective coating 20. The photoresist 22 is patterned, in a conventional lithographic process, to include a via lithographic feature for metal connection 24, a via feature for an air gap 26 and crack stop feature 28. The crack stop lithographic feature 28 is preferably outside the active area of the structure, and is more preferably provided about an outer perimeter (or circumference) of the active region.

The via feature for an air gap 26 is an optional feature contemplated by the invention. In implementation, the resulted air gap 26 effectively lowers the dielectric constant of the low-k material 16. It should be recognized by those of skill in the art that the features 24, 26 and 28 are but one combination of features contemplated by the invention, and that other features are also contemplated by the invention.

Figure 2:
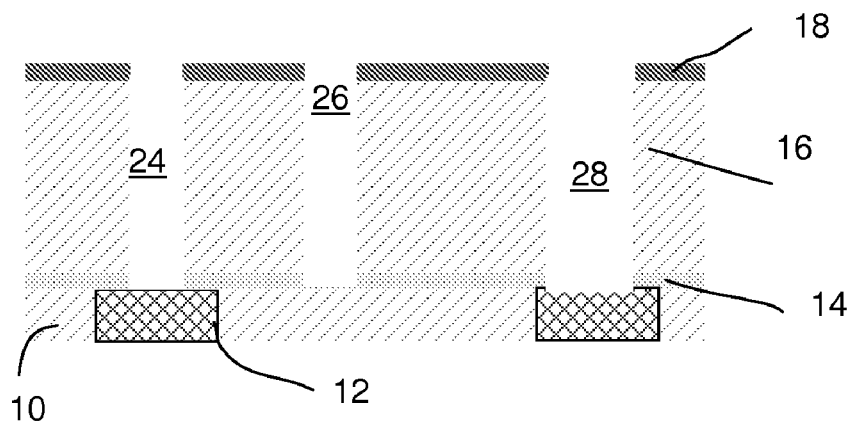

FIG. 2 shows an additional fabrication step in accordance with the invention. In FIG. 2, the via feature for the metal connection 24, the via feature for the air gap 26 and the crack stop lithographic feature 28 are patterned through the low-k dielectric material 16 and the hardmask 14. Optionally, only one or any combination of the features 26 and 28 may be etched to the hardmask 14. During this process, the photoresist 22 and ARC 20 are stripped from the structure, exposing the capping layer 18. It should be recognized by those of skill in the art that width of the crack stop feature 28 can be less than a 1 um wide, mainly due to the fact that RIE process only has to etch through a single layer of low-k dielectric material 16. The low-k dielectric material 16 may be on the order of approximately 300 nm.

Figure 3:
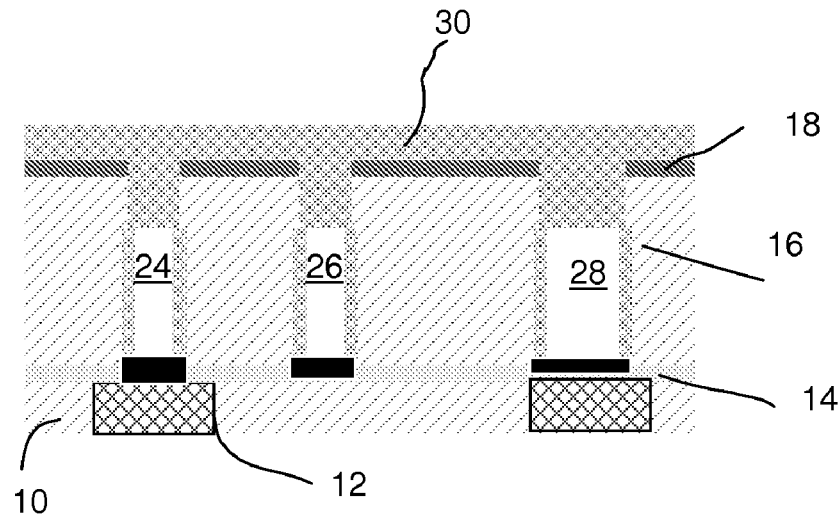

In FIG. 3, a CVD process is performed to cover the sidewalls (and bottom) of the via features 24, 26 and 28. In embodiments, the CVD may be an inorganic deposition process. By way of illustration, the inorganic deposition process forms an inorganic film 30 which coats the sidewalls (and bottom) of the via feature for the metal connection 24, the via feature for the air gap 26 and the crack stop lithographic feature 28. Moreover, as shown in FIG. 3, the inorganic film 30 pinches off (e.g., blocks) the opening for the via feature of the metal connection 24, the via feature of the air gap 26 and the crack stop lithographic feature 28. By closing off the air gap 26 and the crack stop lithographic feature 28, it is possible to maintain the air gap and the crack stop features through subsequent processing steps. In further embodiments, the inorganic film may be planarized using, for example, conventional chemical mechanical processes.

Figure 4:
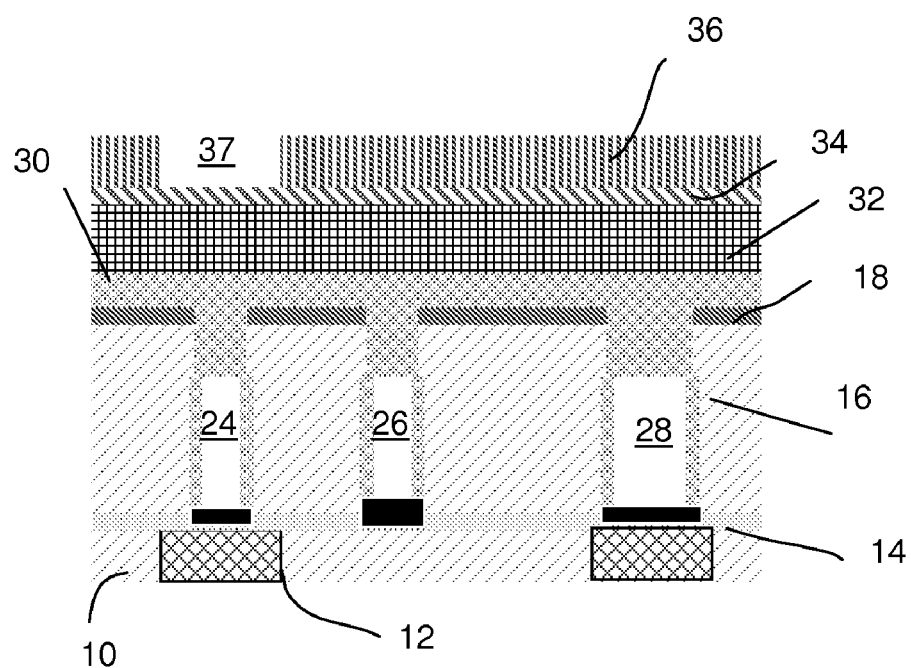

In FIG. 4, an underlayer coating 32 of, for example, organic material is deposited over the inorganic film 30, in a conventional manner. An ARC layer 34, of either organic or inorganic materials, may be deposited on the surface of the underlayer coating 32. A spin on lithographic image layer 36 is provided on the ARC layer 34. The spin on lithographic image layer 36 may be a positive or negative photoresist material. In embodiments, the lithographic image layer 36 is patterned 37 to align with the underlying metal contact 12. In subsequent steps, the pattern is filled with a metal to form a conventional connection/line to the underlying metal contact 12.

Figure 5:
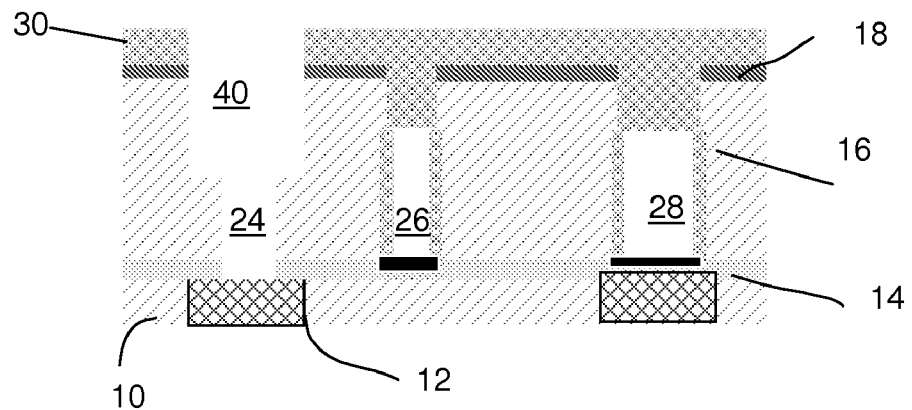
Figure 6:
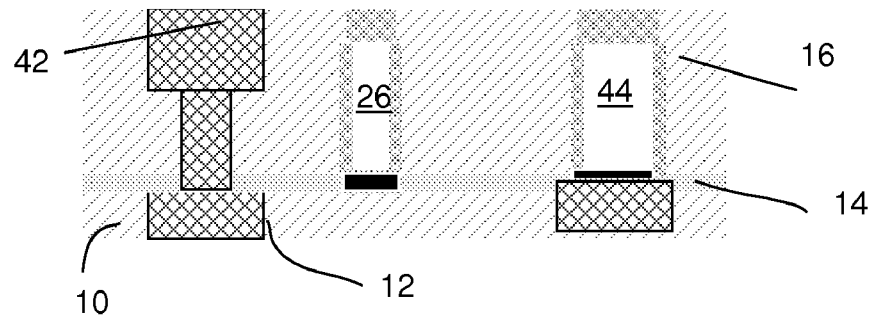

In FIG. 5, a conventional RIE process opens a trench 40 to the via feature for the metal connection 24, while the air gap 26 and the crack stop lithographic feature 28 remain blocked by the inorganic film 30. In FIG. 6, a metallization and CMP process is performed to form the metal connection 42 to the metal connect 12, through the opening 40 and the via feature 24. As shown in FIG. 6, since the crack stop lithographic feature is blocked during this processing step, the crack stop 44 and air gap 26 remain, intact, in the first level formed from the low-k dielectric material 16.

Figure 7:
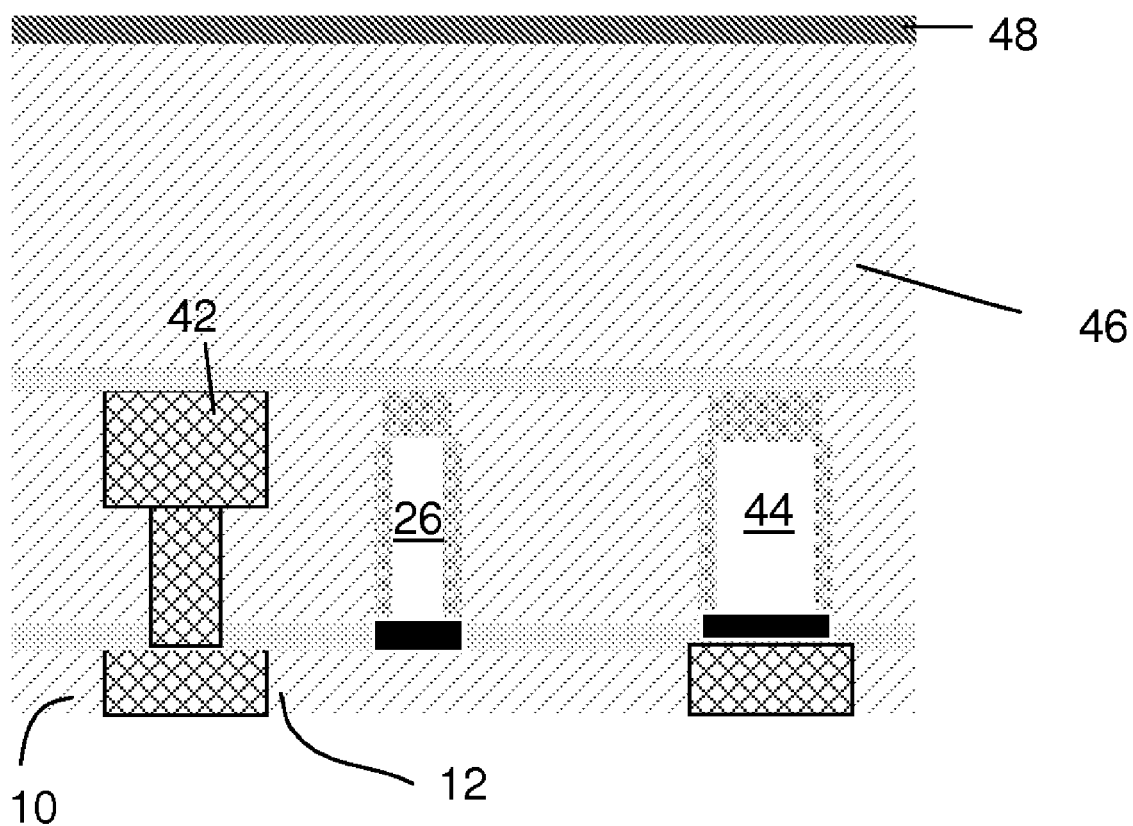

In FIG. 7, a second interlevel dielectric material 46 is deposited over the structure of FIG. 6. This process begins the formation of a second level of the multilevel structure. As in FIG. 1, the dielectric material 46 is preferably a low-k dielectric material such as, for example, an organosilicate glass (OSG) film formed by conventional CVD processes. A hardmask 48 is deposited on the interlevel dielectric material 46. The hardmask 48 may be an oxide or nitride based material, for example.

Figure 8:
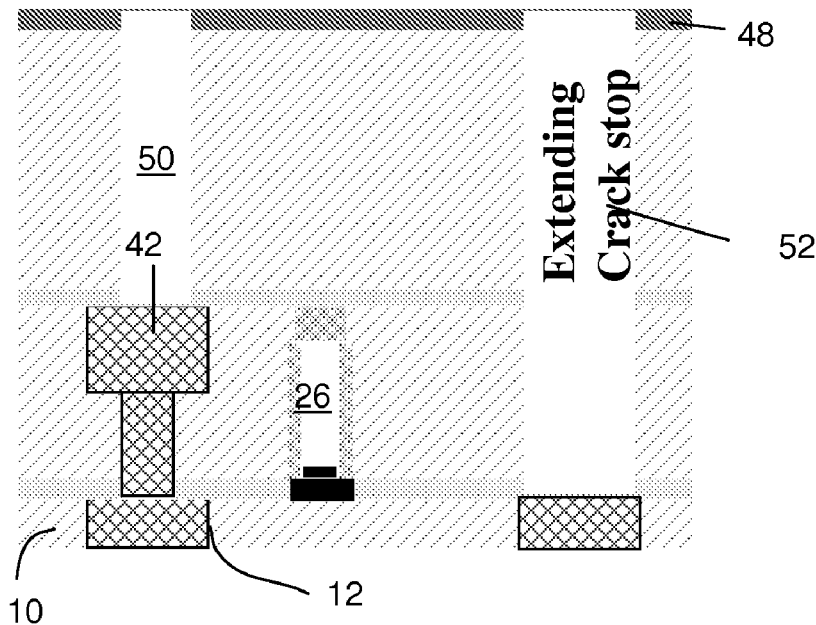

In FIG. 8, the hardmask 48 and second interlevel dielectric material 46 are etched using, for example, conventional RIE processes. In embodiments, the etching forms vias 50 and 52, respectively, which are aligned with the metal connection 42 and the crack stop 44. As previously discussed, the via 52 may be less than a 1 um wide, mainly due to the fact that RIE process only has to etch through a single layer of low-k dielectric material.

Figure 9:
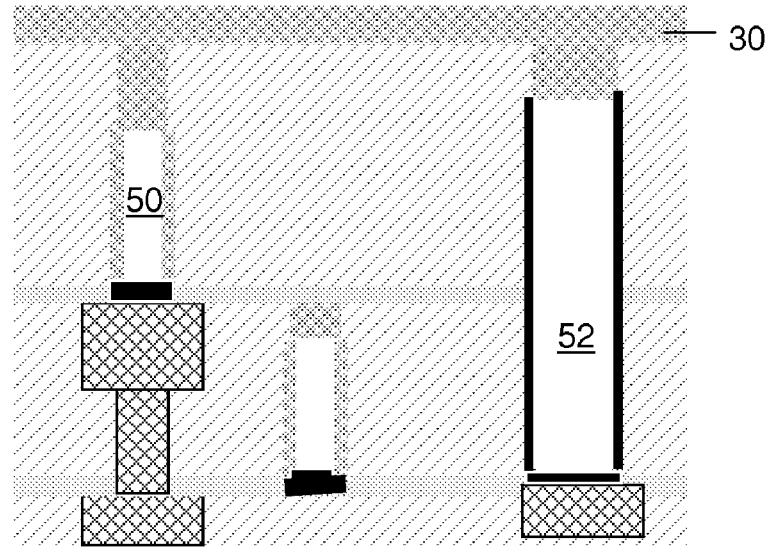

FIG. 9 shows a CVD fill process similar to that described with reference to FIG. 3. In particular, an inorganic deposition process forms an inorganic film 30 which coats the sidewalls (and bottom) of the vias 50 and 52. Moreover, as shown in FIG. 9, the inorganic film 30 pinches off (e.g., blocks) the vias 50 and 52. In further embodiments, the inorganic film may be planarized using, for example, conventional chemical mechanical processes.

Figure 10:
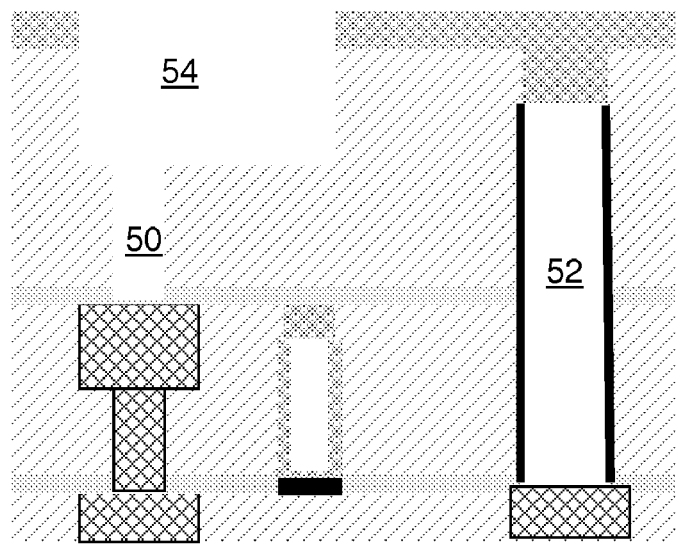

FIG. 10 shows the formation of a trench 54 over the via 50, in any conventional manner. By way of one illustrative non-limiting example, similar to that described with reference to FIGS. 4 and 5, an underlayer coating of, for example, organic material is deposited over the inorganic film 30. An antireflective layer, of either organic or inorganic materials, may be deposited on the surface of the underlayer coating. A spin on photo image layer is provided on the antireflective layer. In embodiments, the lithographic image layer is patterned in alignment with the underlying metal connection 42. A conventional RIE process opens a trench 54 to the via 50.

Figure 11:
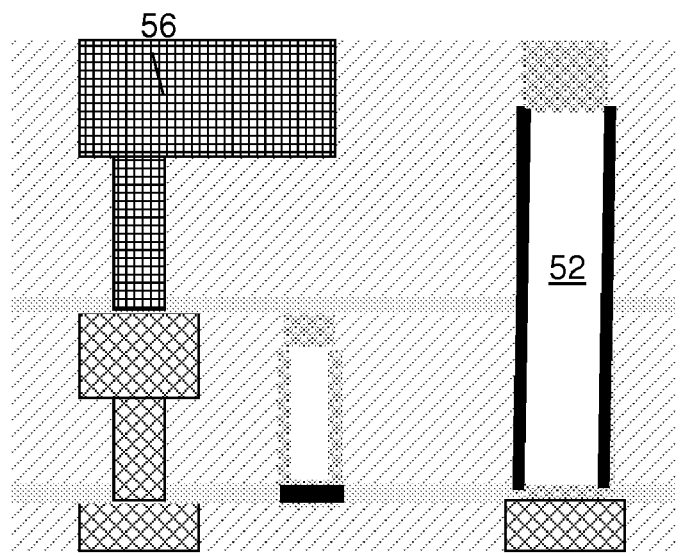

In FIG. 11, a metallization and CMP process is performed to form a metal connection 56 to the underlying metal connection 42. As shown in FIG. 11, the inorganic film 30 pinches off (e.g., blocks) the via 52 thus blocking any metal from entering the crack stop 44. In this manner, the crack stop 44 has now been extended to the second level of the multilevel structure, while maintaining an overall width of about less than 1 um.

Figure 12:
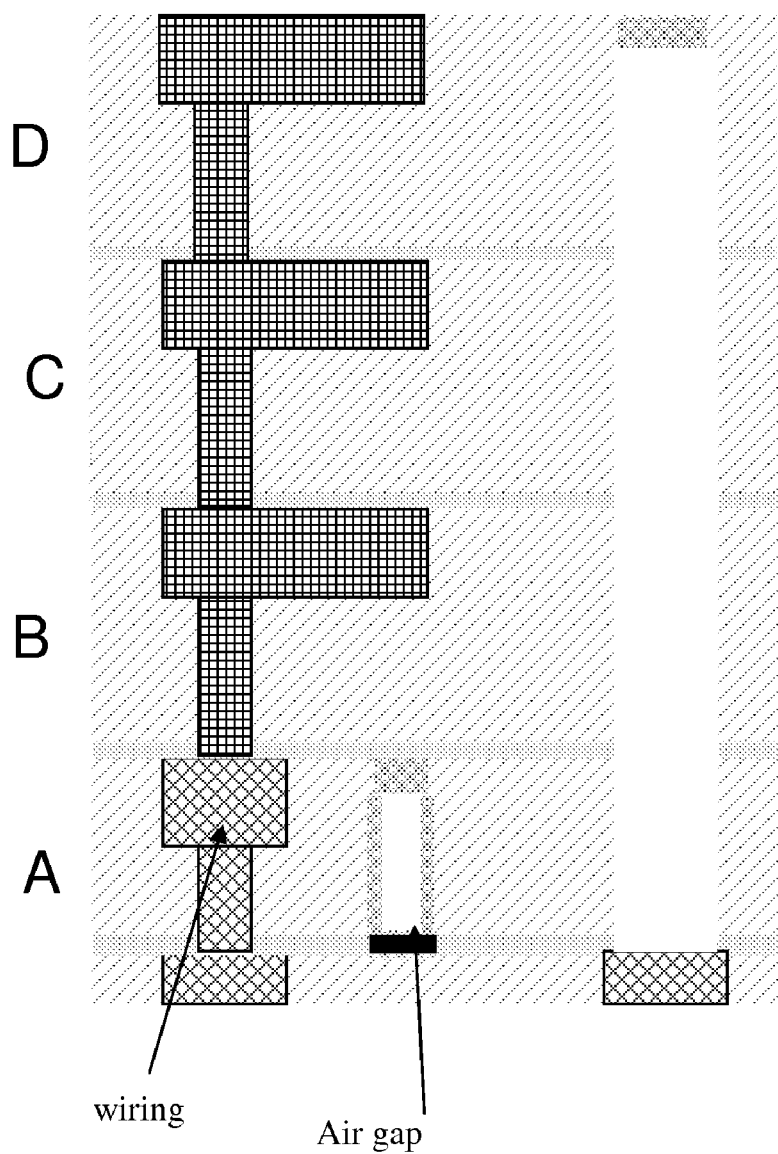
FIG. 12 shows a repeat multilevel build of a structure manufactured in accordance with the invention.

FIG. 12 shows a final multilevel structure fabricated in accordance with the invention. In this structure, there are four levels A-D, each of which includes a metallization or connection line. As shown in FIG. 12, the crack stop 44 extends through each level A-D, maintaining its width (e.g., about less than 1 um) throughout the structure.

Figure 13:
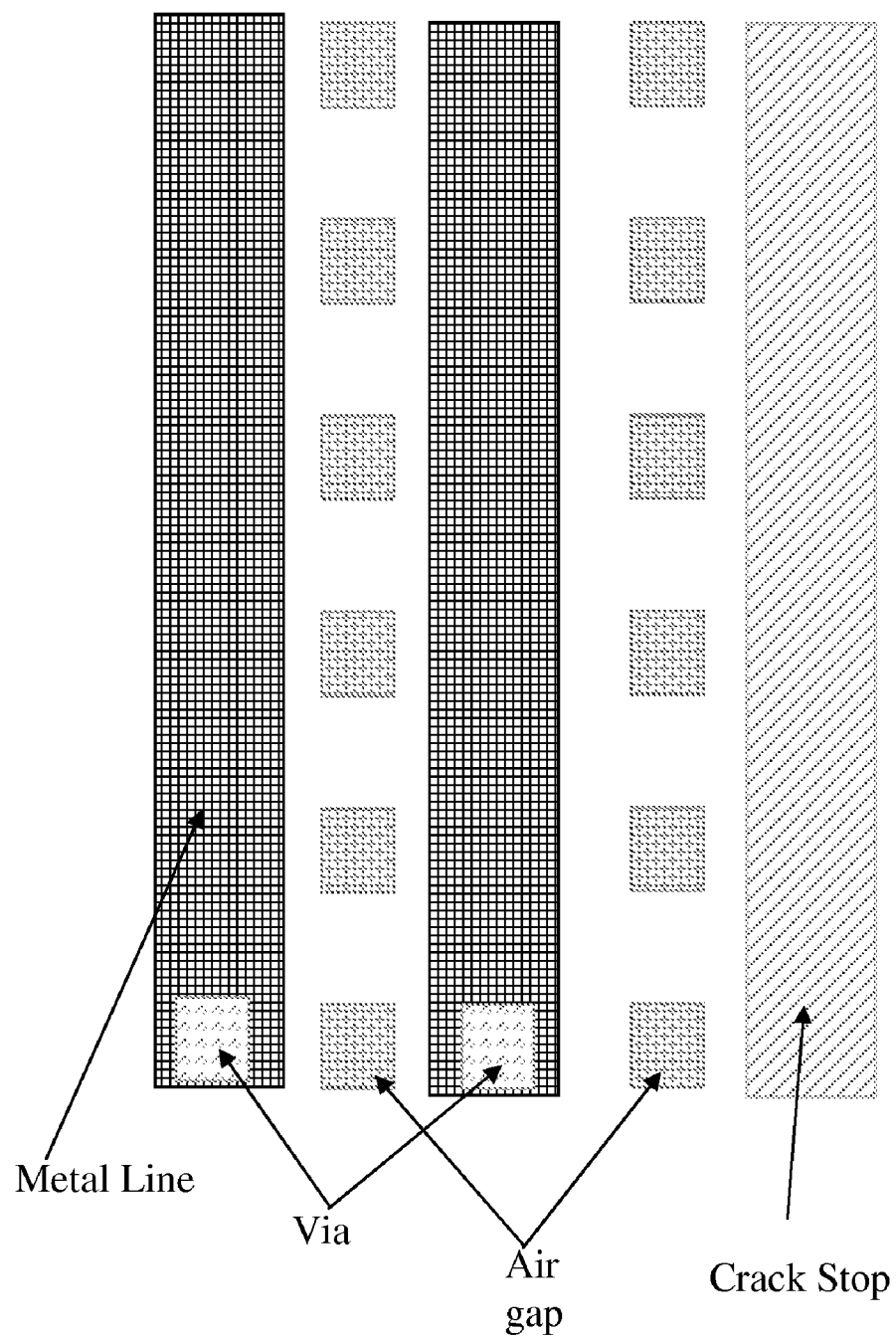
FIG. 13 shows a top down view of a structure manufactured in accordance with the invention.

FIG. 13 shows a top down view of the structure formed in accordance with the invention. It should be recognized that the crack stop feature of the present invention is not fabricated with a single RIE process at the BEOL. Instead, the crack stop feature of the present invention is formed during the processing steps of each level, thus minimizing the resultant width of the crack stop throughout the entire structure.

The semiconductor device as described above may be part of the design for an integrated circuit chip. In embodiments, the chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of embodiments, those skilled in the art will recognize that the invention can be practiced with modifications and in the spirit and scope of the appended claims.

What is claimed:

1. A method of forming a structure, comprising:
   forming a connection via in a level of dielectric material;
   forming a crack stop feature via in the level of dielectric material;
   filling the connection via with metallization while blocking off the crack stop feature via to form a crack stop structure in the level of dielectric material; and
   forming an air gap feature in the first level of dielectric by forming an air gap via and blocking the air gap via during the filling, wherein
   the crack stop structure extends through at least a second level of dielectric by forming a via through at least the second level of dielectric and blocking the via while performing a metallization process which forms a higher level connection feature,
   the blocking comprises an chemical vapor deposition process to pinch off openings of the crack stop feature via,
   the crack stop feature via and a portion of the connection via are formed in a single etching step,
   the crack stop structure is formed outside an active area, and
   the crack stop structure has a width of about less than 1 um.

* * * * *